United States Patent [19]
Nakatsuka et al.

[11] Patent Number: 5,809,053
[45] Date of Patent: Sep. 15, 1998

[54] SEMICONDUCTOR LASER DEVICE AND OPTICAL PRINTING APPARATUS USING THE SAME

[75] Inventors: Shin'ichi Nakatsuka, Hino; Seiji Maruo, Hitachi; Shinya Kobayashi, Mito; Akira Arimoto, Kodaira; Susumu Saito, Hachioji, all of Japan

[73] Assignees: Hitachi, Ltd.; Hitachi Koki Co., Ltd., both of Tokyo, Japan

[21] Appl. No.: 675,479

[22] Filed: Jul. 3, 1996

[30] Foreign Application Priority Data

Jul. 19, 1995 [JP] Japan ................................ 7-169662

[51] Int. Cl.⁶ ............................................. H01S 3/19
[52] U.S. Cl. ................... 372/46; 372/45; 372/50
[58] Field of Search .................. 372/45, 46, 50

[56] References Cited

U.S. PATENT DOCUMENTS

| | | | |
|---|---|---|---|
| 4,251,780 | 2/1981 | Scifres et al. | 372/45 |
| 5,524,013 | 6/1996 | Nakatsuka et al. | 372/46 |
| 5,602,864 | 2/1997 | Welch et al. | 372/46 |

OTHER PUBLICATIONS

Holland, Gary L., "A Resolution Enhancement Technique for Electrophotographic Printers", SID 90 DIGEST pp. 278–279, 1990 (no month).

Casey, H. C. Jr., Heterostructure Lasers, Academic Press 1978, pp. 30–57 (no month).

*Primary Examiner*—James W. Davie
*Attorney, Agent, or Firm*—Antonelli, Terry, Stout, & Kraus, LLP

[57] ABSTRACT

A semiconductor laser device is disclosed, in which two semiconductor layers of different conduction types are formed on a semiconductor substrate, an active semiconductor layer having a forbidden band width narrower than the two semiconductor layers is formed between the two semiconductor layers, and a waveguide encloses the light in a plane parallel to the active layer. The waveguide includes at least two regions of different widths. The wider one of the waveguide regions is located in the vicinity of the end surface of the semiconductor laser. A relation holds that $\pi/6 < L \times (K_0 - K_2) < \pi \times 5/6$, where L is the length of the wider waveguide region, and $K_0$, $K_2$ are propagation constants of the zeroth-order and second-order transverse modes, respectively, propagating in the waveguide.

12 Claims, 10 Drawing Sheets

FIG. 1
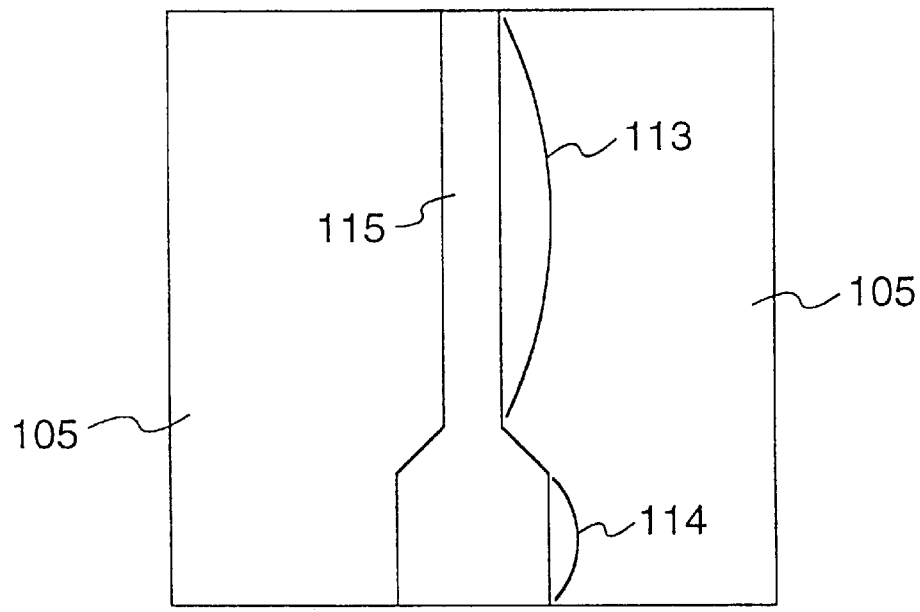
FIG. 2A
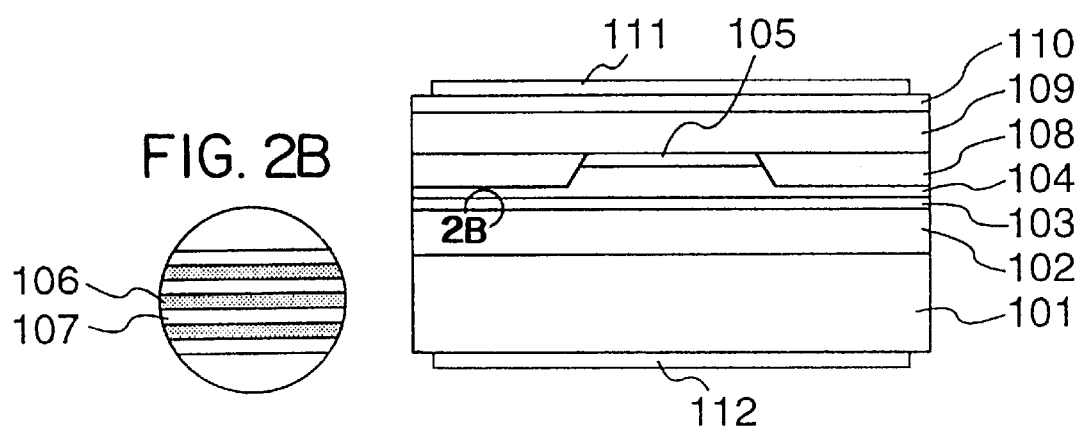
FIG. 2B

FIG. 4
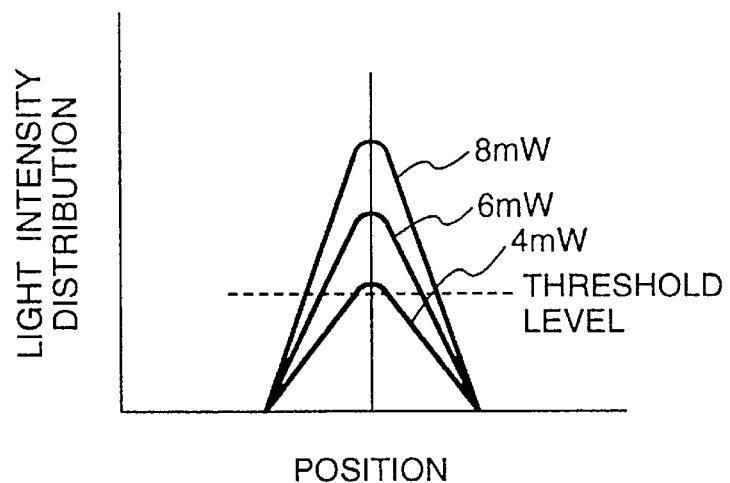
FIG. 5A
FIG. 5B
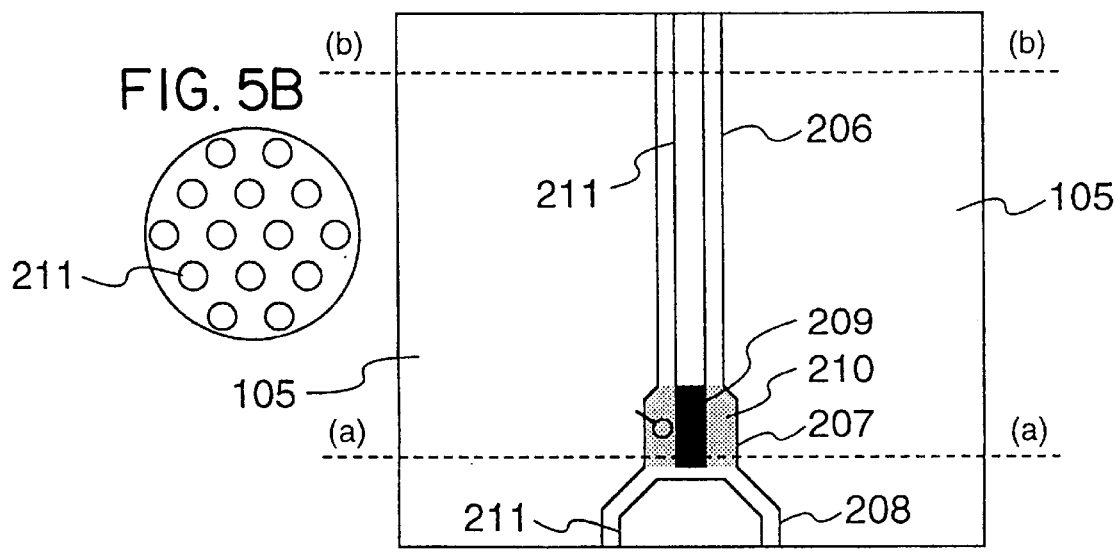

FIG. 6A-1
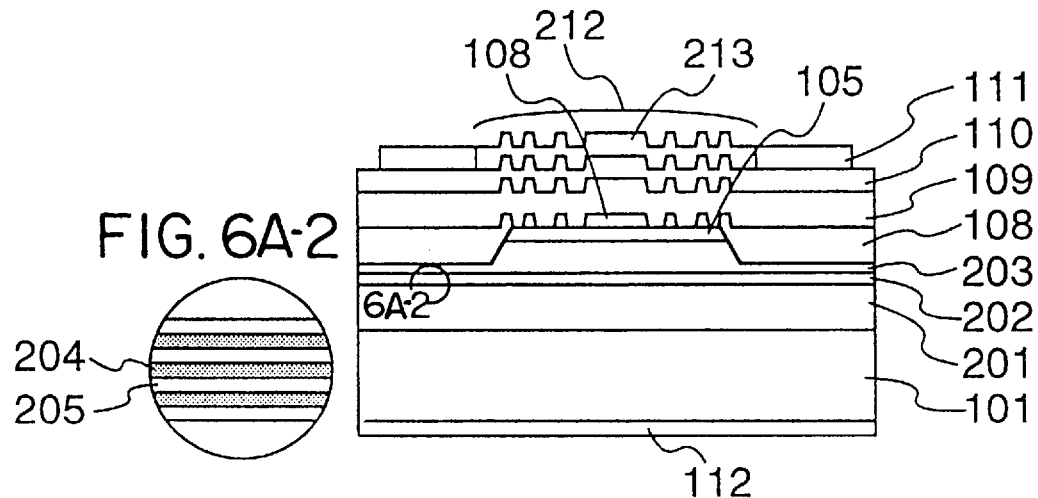
FIG. 6A-2
FIG. 6B-1
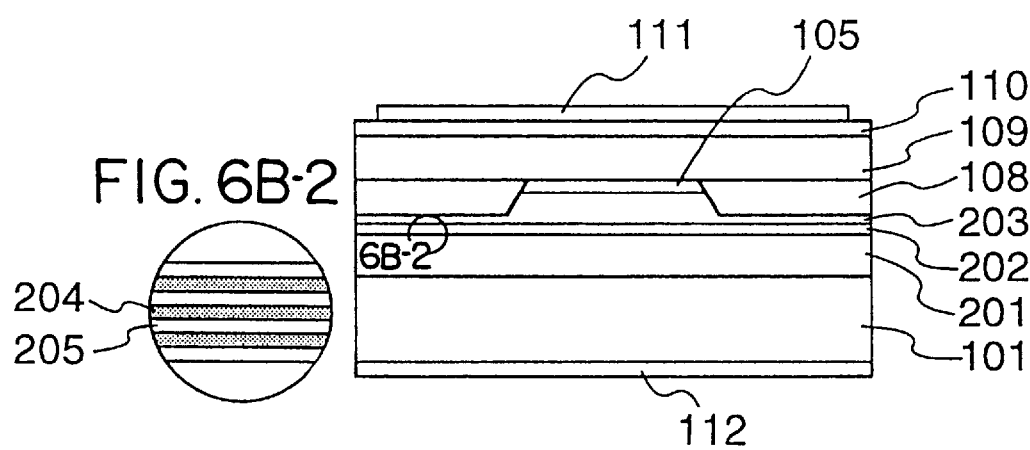
FIG. 6B-2

FIG. 9A-1
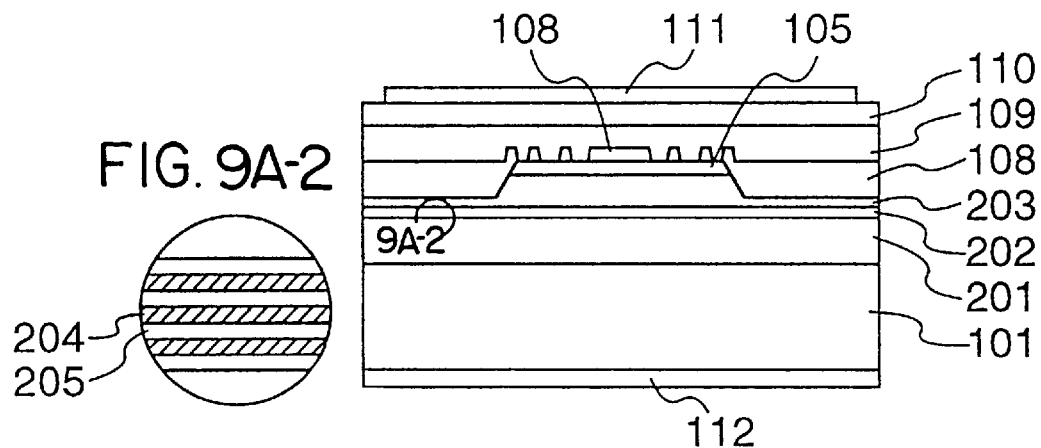
FIG. 9A-2
FIG. 9B-1
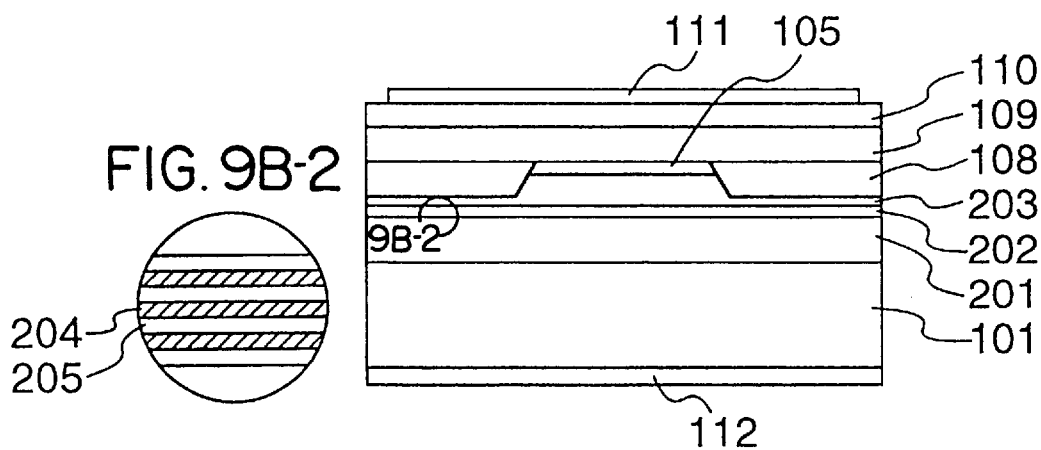
FIG. 9B-2

FIG. 16A
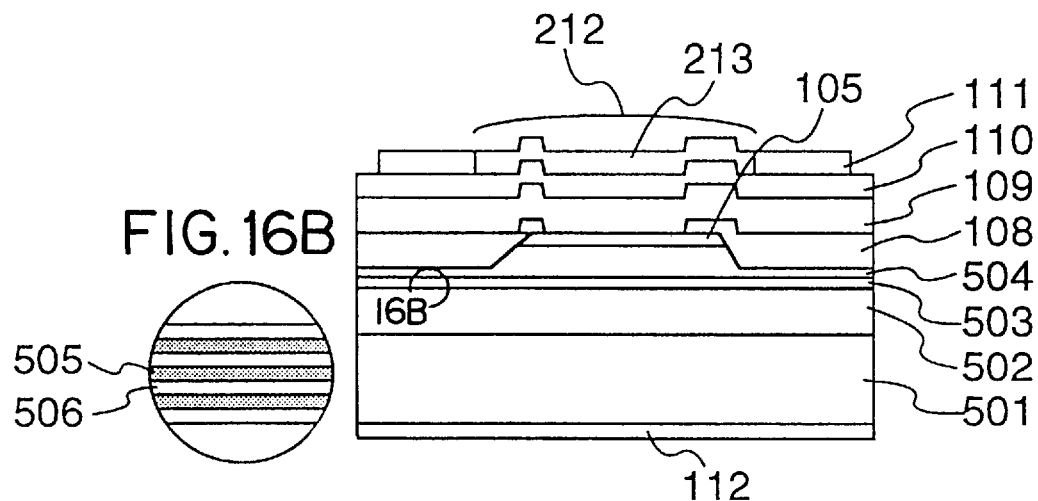
FIG. 16B
FIG. 17
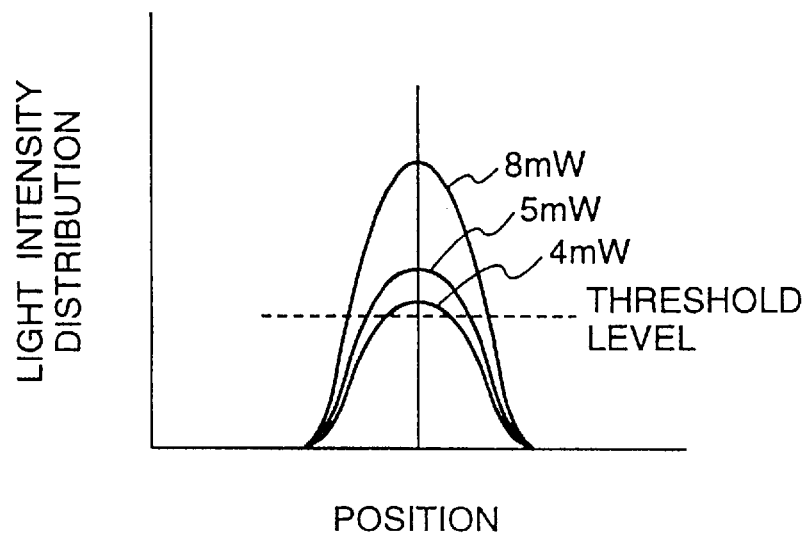

SEMICONDUCTOR LASER DEVICE AND OPTICAL PRINTING APPARATUS USING THE SAME

BACKGROUND OF THE INVENTION

The present invention relates to a semiconductor laser device used as a light source for a laser printer or the like and an optical printing apparatus using such a semiconductor laser device.

A method for improving the resolving power of a laser printer has been proposed, in which taking advantage of the characteristics of a light-sensitive material that only those parts irradiated with the light of an intensity exceeding a light-sensing threshold assumes such a potential level as to attract coloring particles, the output of a semiconductor laser having a light intensity distribution as shown in FIG. 17 is changed to control the printing dot size.

A reference cited as an art relating to this technique is SID 90 DIGEST, pp. 278–279.

The conventional method described above has the problem that the relation between the printing dot size and the optical output is so complex that all the correlation data between the optical output and the dot size must be recorded, and therefore a dot size control circuit having a large memory capacity is required. Also, in view of the fact that the intensity distribution gradient is gentle in the area near the crest or tail of the optical intensity distribution curve, the print dot size is considerably varied, thereby making it difficult to control the image quality.

SUMMARY OF THE INVENTION

A first object of the invention is to provide a semiconductor laser device capable of controlling the printing dot size stably with the modulation of optical output.

A second object of the invention is to provide an optical printing apparatus using such a semiconductor laser device.

In order to achieve the first object, according to a first aspect of the present invention, there is provided a semiconductor laser device comprising two semiconductor layers of different conduction types, an active layer interposed between the two layers and forming a semiconductor layer having a forbidden band width narrower than the two semiconductor layers, and a waveguide for enclosing light in a plane parallel to the active layer, wherein the waveguide is so structured that the density distribution of laser beam at the end surface of a laser changes substantially linearly in the lateral direction from the center line of the waveguide.

As an example of obtaining a density of a beam-shaped light as described above, a waveguide is composed of at least two types of regions having different widths. Also, the wider one of the regions having different widths of the waveguide is preferably structured partly with a different current injection amount from the other regions. In the case where there are three types or more of regions with different widths, for example, the above-mentioned structure can be employed for any of the regions wider than the narrowest one, i.e., the widest region or the second-widest region.

In order to achieve the first object mentioned above, according to another aspect of the present invention, there is provided a semiconductor laser device comprising two semiconductor layers of different conduction types, an active layer interposed between the two semiconductor layers and forming a semiconductor layer having a forbidden band width narrower than the two semiconductor layers, and a waveguide for enclosing the light in a plane parallel to the active layer, wherein the waveguide is so structured that when the laser from the semiconductor laser device is irradiated on a photo-conductor film, the region of the photo-conductor film exceeding a light-sensing threshold is varied as a simple function of the optical output. Accordingly, this region increases with substantially linear relationship with inverse number of the optical output with respect to increase of the optical output.

In order for the region of the photo-conductor film exceeding a light-sensing threshold to be varied as a simple function of the optical output, a waveguide is configured of at least two types of regions having different widths. Also, the wider one of the regions of the waveguide is partly structured to have a different current injection amount than the other regions, so that a larger dot size variation can be obtained. In the case where there are three or more types of regions having different widths, the above-mentioned structural relation can be employed for any region wider than the narrowest region, i.e., the widest region or the second-widest region.

Further, in order to achieve the first object described above, according to still another aspect of the present invention, there is provided a semiconductor laser device comprising two semiconductor layers of different conduction types, an active layer interposed between the two semiconductor layers and forming a semiconductor layer having a forbidden band width narrower than the two semiconductor layers, and a waveguide for enclosing the light within a plane parallel to the active layer, wherein in order to control the beam shape at the end surface of a laser, the waveguide includes at least two types of regions having different widths.

This semiconductor laser device is preferably so structured that the wider one of the regions of different widths of the waveguide is partially different in the current injection amount from the other regions.

In the above-described configuration of a semiconductor laser, the geometrical variations of the waveguide or the structure formed on the waveguide for modulating the current injection produces unevennesses in the surface of the semiconductor laser, which sometimes has an adverse effect on the reliability of the semiconductor laser. In order to avoid this problem, according to the present invention, the part of the front electrode of the semiconductor laser which is located around the waveguide is removed while at the same time bonding the semiconductor laser to a heat sink with the substrate surface up. In the case where a semiconductor laser is bonded to a heat sink with the substrate surface up, the length of the resonator of the semiconductor laser is required to be set in the range of 450 $\mu$m to 1200 $\mu$m in order to prevent the temperature increase of the active layer. With the semiconductor laser bonded to a heat sink with the substrate surface side up, a plurality of such semiconductor lasers can be easily mounted on the same chip. The characteristics can thus be further improved, and a part of individual semiconductor lasers can be used also as a photo-detector. The photo-detector can be provided with the function as an electronic cooling element by applying thereto a voltage lower than the oscillation voltage of the semiconductor laser. Also, a semiconductor laser including an inclined substrate has an asymmetric shape of the waveguide, and therefore hardly can produce a satisfactory beam shape. In view of this, a structure is also proposed with the center of current injection displaced from the center axis of the waveguide.

In order to achieve the second object, according to the invention, there is provided an optical printing apparatus comprising a light-sensitive material used for optical printing, a semiconductor laser device of any type described above for performing the optical recording on the light-sensitive material, means for changing the position of the light-sensitive material irradiated with a laser, and means for controlling the foregoing means.

In the case where the waveguide means of a semiconductor laser device is formed of two waveguides of different widths, high-order transverse mode components are generated in the junctions of the waveguides. These high-order mode components are gradually phase-shifted due to the difference in the dominant mode and the number of waves as they are propagated through the waveguides. If the length of the waveguide means is properly selected, it is possible to obtain a beam shape totally different from the light intensity distribution approximated by Gaussian distribution obtained for the normal semiconductor laser. Also, a similar beam shape can be produced by forming a structure which has two parallel current injection regions in a part of the waveguide means of the semiconductor laser device to utilize the refractive index distribution generated by current injection in such a part.

BRIEF DESCRIPTION OF THE DRAWINGS

FIG. 1 is a plan view showing a semiconductor laser device in the process of fabrication according to the present invention.

FIGS. 2A–2B are a diagram showing a sectional structure of a semiconductor laser device fabricated through the process shown in FIG. 1.

FIG. 4 shows an intensity distribution of the light emitted from the semiconductor laser device according to the embodiment shown in FIGS. 1 and 2A–2B.

FIGS. 5A–5B are plan views showing a semiconductor laser device in the process of fabrication according to another embodiment of the invention.

FIGS. 6A-1, 6A-2, 6B-1 and 6B-2 show a sectional structure of a semiconductor laser device fabricated through the process shown in FIG. 5A–5B.

FIGS. 9A-1, 9A-2, 9B-1 and 9B-2 are diagrams showing the sectional structure of a modification of the embodiment shown in FIGS. 6A-1, 6A-2, 6B-1 and 6B-2.

FIGS. 11A and 11B are diagrams showing a sectional structure of a semiconductor laser device fabricated through the process shown in FIG. 10.

FIGS. 16A and 16B are diagrams showing the sectional structure of a semiconductor laser device fabricated through the process shown in FIG. 15.

FIG. 17 is a diagram showing the light intensity distribution of a conventional semiconductor laser device.

DESCRIPTION OF THE PREFERRED EMBODIMENTS

Figure 3:
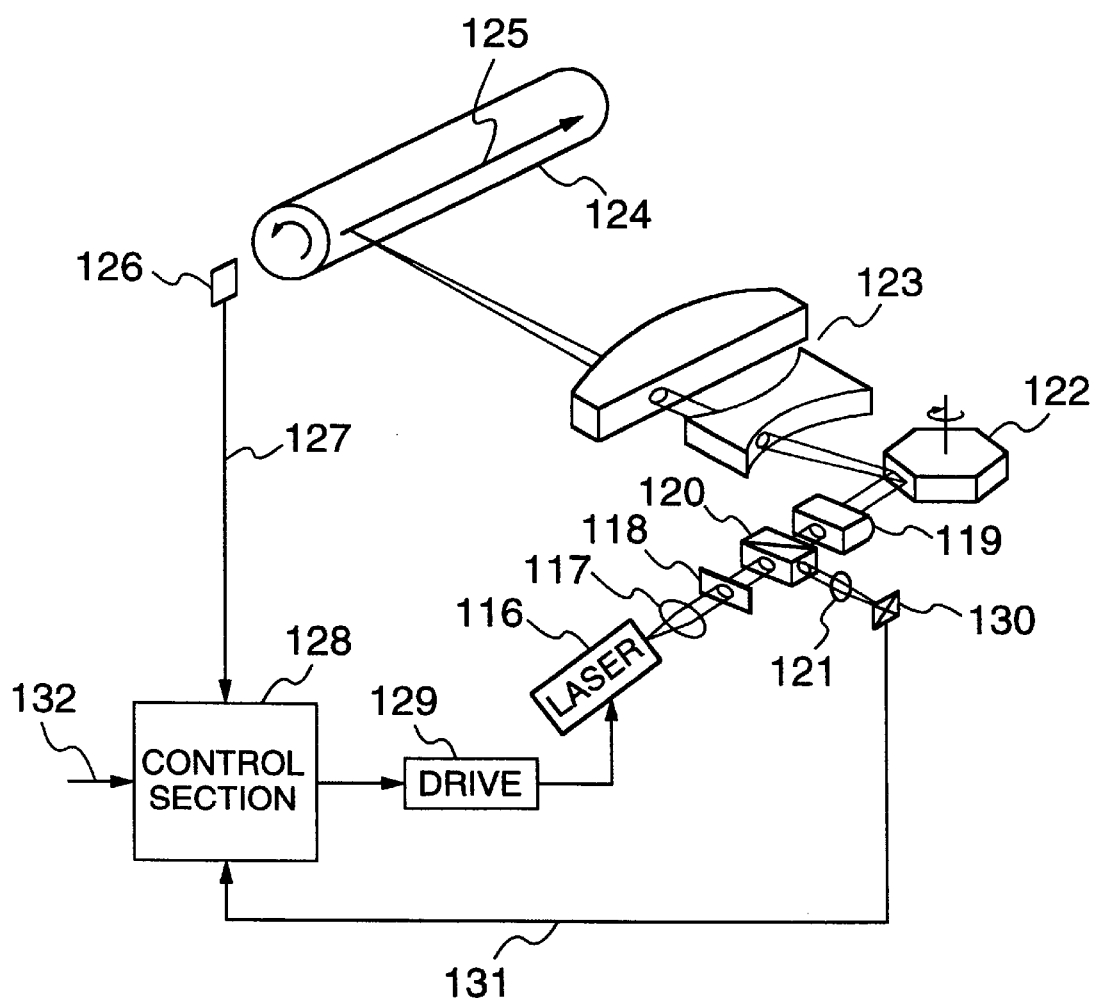
FIG. 3 is a diagram showing the configuration of an example of a laser printing apparatus according to the invention.

An embodiment of the invention will be described with reference to the accompanying drawings. FIGS. 2A and 2B are diagrams showing a sectional structure of a semiconductor laser device that has been fabricated, and FIG. 1 is a plan view showing the same semiconductor laser device in the process of fabrication. First, an $n-Al_{0.5}Ga_{0.5}As$ clad layer 102, a multiple quantum well active layer 103, a $p-Al_{0.5}Ga_{0.5}As$ clad layer 104 and a p-GaAs contact layer 105 are crystal-grown in that order on an n-GaAs substrate 101. The multiple quantum well active layer 103 is formed by depositing each of three GaAs well layers 106 (7 nm) alternately with each of four $Al_{0.3}Ga_{0.7}As$ barrier layers 107 (5 nm).

Then, a striped $SiO_2$ film 115 is formed to the shape shown in FIG. 1 on the p-GaAs contact layer 105 using the thermal CVD (chemical vapor deposition) and photolithography. With this $SiO_2$ film as a mask, the p-GaAs contact layer 105 and the $p-Al_{0.5}Ga_{0.5}As$ clad layer 104 are etched remaining approximately 0.2 $\mu$m, after which an n-GaAs block layer 108 is selectively grown by the metal organic vapor-phase growth process in a region lacking the $SiO_2$ film 115. For reducing the series resistance of the device, the $SiO_2$ film 115 is removed, and then an $Al_{0.5}Ga_{0.5}As$ buried layer 109 and a p-GaAs cap layer 110 are formed. Next, an electrode 111 with Au as a main component is formed on the wafer surface, and the GaAs substrate is etched to about 100 $\mu$m by mechanical grinding and chemical etching process. An electrode 112 with Au as a main component thus is formed also on the GaAs substrate side. This semiconductor wafer is cleaved into bars at intervals of about 600 $\mu$m. The semiconductor laser oscillates at oscillating frequency about 780 nm.

A striped waveguide forming a laser resonator is configured of a region about 4 $\mu$m wide (corresponding to the region 113 in FIG. 1) and a region about 6 $\mu$m wide (corresponding to the region 114 in FIG. 1). The length of the 6-$\mu$m wide region is set to about 45 $\mu$m so that the phase difference between the dominant mode and the high-order modes is $\pi/4$ at the laser end surface. In the case where a laser resonator is configured of a narrow striped waveguide and a wide striped waveguide as described above, the width of the latter waveguide is preferably about 1.1 to 1.9 times, or more preferably, about 1.4 to 1.6 times as large as that of the former.

As described above, in the case where stripes of different widths are coupled with each other, assume that light of dominant transverse mode enters for the narrow stripe enters the wide stripe. The energy of the incident light is distributed among a plurality of transverse modes of the wide stripe. The ratio of energy distribution is determined by the spatial superposition between the dominant transverse mode of the narrow stripe and the transverse mode of the wide stripe. In order to produce a beam with a substantially triangular light intensity distribution by coupling the stripes of two different widths, the ratio of width between the two stripes is appropriately set to a range of 1.1 to two.

In the case where of the ratio of stripe widths exceeds two, the energy of light proceeding from the narrow stripe to the wide stripe is mainly distributed among transverse modes of second or higher orders in the wide stripe, with a result that a side lobe is developed in the emitting beam, leading to an irregular shape of the spot. With the ratio of stripe widths below unity, on the other hand, the energy distributed to the second-order transverse mode of the wide stripe is so small that a sufficient effect cannot be produced.

As described above, the energy of light incident on the wide stripe is distributed among a plurality of transverse modes. In the neighborhood of the boundary surface between the narrow and wide stripes, however, the shape of the beam obtained by the overlapping of the two modes is generally coincidental with that of the beam incident from the narrow stripe. Since each transverse mode of the wide stripe has a different propagation constant corresponding to the order thereof, however, a phase shift occurs among the transverse modes according as the beam proceeds through the wide waveguide. The beam assumes a shape substantially similar to a desired triangle when the phase shift between the dominant mode and the second-order mode satisfies the relation $L=(K_2-K_0)=\pi/2$.

Also, a substantially effective result is obtained when the relation is satisfied that $\pi/6<L\times(K_2-K_0)<5\pi/6$, where L is the length of the wide stripe, and $K_0$, $K_2$ are the propagation constants for the dominant transverse mode and the second-order transverse mode in the wide stripe, respectively. In this embodiment, $K_0=3.32952(2\pi/\lambda)$ and $K_2=3.3252(2\pi/\lambda)$. A method of calculating the propagation constant, though not be described in detail here, is by using the technique for determining the effective refractive index of a slab waveguide as described, for example, in "HETEROSTRUCTURE LASERS" by H. C. Casey and M. B. Panish, Academic Press, 1978, pp. 31–57.

First, a slab waveguide model is employed for the layered structures in and outside a stripe to determine the effective refractive index of each layered structure. Then, the effective refractive index thus obtained of each layered structure is used as the refractive index of a new slab waveguide by applying a similar technique. The effective refractive index n of a waveguide can thus be determined from the sectional structure of a laser. The propagation constant K is obtained from $K=2\pi n/\lambda$ (where $\lambda$ the wavelength of light in vacuum). The refractive index varies with the order of the transverse mode of light, so that each transverse mode has a different propagation constant.

FIG. 3 shows an example configuration of an optical system of a laser printer including a semiconductor laser device according to the invention. The laser beam emitted from a semiconductor laser device 116 passes through a collimate lens 117, a light quantity regulating filter 118, a beam splitter 120 and a cylindrical lens 119 and enters a polygon mirror 122 of a light deflection device. Then, with the rotation of the polygon mirror 122, the light is reflected and deflected. While, in the area of $5\pi/6<L\times(K_2-K_0)<7\pi/6$, though superiority of the beam shape is not maintained, however, since divergence of the beam becomes the maximum, therefore the optical output is improved. Since above explained phase relation is the phase of periodic function, phase θ is the same as $2N\pi\pm\theta$ (N is an integer). The cylindrical lens 119 is to converge the laser beam on a line perpendicular to the rotational axis on the mirror surface in order to correct the scanning position deviation due to the parallelism error of the polygon mirror. Further, the laser beam is converged on the scanning surface covered with a photo-conductor film 124 by a scanning lens system 123 thereby to scan on the scanning position repeatedly at uniform speed. The scanning surface is moved at uniform speed in the direction perpendicular to the beam scan. A light detector 126 is for detecting the start position of the scanning beam. A detection signal from the light detector 126 is sent to a controller 128 as a sync signal 127. Also, a signal from a beam splitter 120 is sensed by a light quantity sensor 130 through a focusing lens 121 thereby to transmit a light quantity detection signal 131 to the controller 128. The controller 128 controls these components on the basis of an image signal 132. A laser drive system 129 is for driving the semiconductor laser 116 based on the control output from the controller 128.

The control of the light output by the controller 128 corresponding to the beam diameter can be easily realized by an analog integrated circuit for setting a light output proportional to the discharge period of a charge/discharge circuit including a combination of, for example, a capacitor, a resistor and a flip-flop circuit.

FIG. 4 is the light intensity distribution obtained on a light-sensitive surface when a semiconductor laser device according to this embodiment is driven with a light output of 4 mW, 6 mW and 8 mW respectively. The light-sensing threshold of the light-sensitive material is defined by the dashed line in the figure. The dot size printed, therefore, changes with the light output as a simple function of $W=2W_0(1-P_0/P)$, where W is the dot diameter, $W_0$ is the half-value width of the dot, $P_0$ is the threshold sensitivity, and P is the peak value of the light intensity distribution of the laser beam. A smooth print corresponding to the light output can thus be obtained with a high reproducibility.

Another embodiment of the invention will be described with reference to the accompanying drawings. FIGS. 6A-1, 6A-2, 6B-1 and 6B-2 are diagrams showing a sectional structure of a semiconductor laser device fabricated, and FIGS. 5A and 5B are plane views of the same semiconductor laser device in the process of fabrication. The sectional structure in a position associated with line a—a in FIGS. 5A is shown in FIGS. 6A-1 and 6A-2 and the sectional structure in a position associated with line b—b is shown in FIGS. 6B-1 and 6B-2. First, an n-$(Al_{0.5}Ga_{0.5})_{0.5}In_{0.5}P$ clad layer 201, a multiple quantum well active layer 202, a p-$(Al_{0.5}Ga_{0.5})_{0.5}In_{0.5}P$ clad layer 203 and a p-GaAs contact layer 105 are deposited in that order by crystal growth on an n-GaAs substrate 101. The multiple quantum well active layer 202 is formed of three $Ga_{0.5}In_{0.5}P$ well layers 204 (7 nm) each deposited alternately with each of four $(Al_{0.5}Ga_{0.5})_{0.5}In_{0.5}P$ barrier layers 205 (5 nm).

Then, as shown in FIGS. 5A and 5B, a composite mask of a photoresist mask 206 and an $SiO_2$ mask 211 is formed in stripes on the resulting assembly using the thermal CVD process and photolithography. This composite mask is formed by first forming an $SiO_2$ mask having a groove 215 along the periphery of the desired pattern 214, then depositing the photoresist mask 206 covering the desired pattern 214 and the peripheral groove 215, after which the $SiO_2$ outside the groove is etched off to retain only the desired $SiO_2$ pattern 215 covered with the photoresist. This method can set the shape of the waveguide of the semiconductor laser and the position of current injection substantially independently of each other.

The photoresist mask 206 is so shaped that a stripe 206 having a normal width (about 4 μm) representing the major portion of the device expands in two stages in the neighborhood of the end surface thereof. Using this photoresist mask, the p-GaAs contact layer 105 and the p-$(Al_{0.5}Ga_{0.5})_{0.5}In_{0.5}P$ clad layer 203 etched off remaining about 0.2 μm. Then the photoresist is removed, and the n-GaAs block layer 108 is selectively deposited in a region lacking the $SiO_2$ film by the metal organic vapor-phase growth method.

Figure 7A:
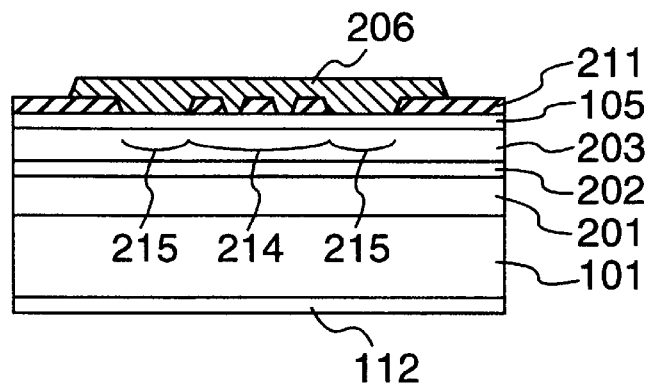
FIGS. 7A and 7B are sectional views showing the process for fabricating the semiconductor laser device of FIGS. 6A-1, 6A-2, 6B-1 and 6B-2.
Figure 7B:
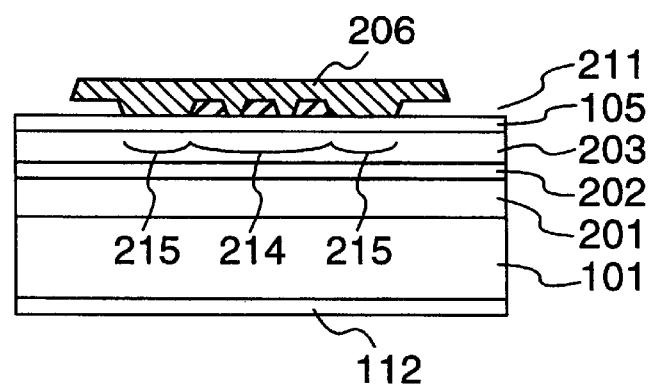

FIGS. 7A, 7B show a sectional structure in the process of forming the desired pattern on the device of FIGS. 6A-1, 6A-2, 6B-1 and 6B-2. The $SiO_2$ mask 211 is formed thinner by the width of the groove 215 than the photoresist mask in the normal-width region and the wide region. In the intermediate-width region, the SiO2 mask 211 is formed in the central non-conductive region 209 and part of the halftone region 210 (a circular portion in FIGS. 5B) on both sides of the region 209. Numeral 214 designates the desired pattern, and numeral 215 the peripheral groove of the pattern.

Next, in order to reduce the series resistance of the device, the $SiO_2$ film is removed, followed by forming the p-$Al_{0.5}Ga_{0.5}As$ buried layer 109 and the p-GaAs cap layer 110. Then, the electrode 111 with As as a main component is formed on the wafer surface.

In the process, the surface electrode 111 has a region 212 from which the electrode material is removed using the normal lift-off process. The electrode thus is not existent on the waveguide of the semiconductor laser but only the $SiO_2$ mask 213 used for lift-off remains unremoved. As a result, diffusion of a metal element into the semiconductor or stress thereof which otherwise might be caused by the breakage of the electrode is prevented, thereby realizing a device with high reliability. This electrode structure is found effective with a ridge-buried semiconductor laser, especially with the present embodiment in which complicated unevennesses are generated in the surface of the waveguide.

A similar measure against the generation of unevennesses is possible by growing the crystal of the p-$Al_{0.5}Ga_{0.5}As$ buried layer 109 and the p-GaAs cap layer 110 by the liquid phase growth process whereby a substantially flat surface is formed as shown in FIGS. 9A-1, 9A-2, 9B-1 and 9B-2.

The GaAs substrate is etched to about 100 μm by mechanical grinding and chemical etching process, after which the electrode 112 with Au as a main component is formed also on the GaAs substrate side. This semiconductor wafer is cleaved into bars at intervals of about 600 μm to form a semiconductor laser device.

In the case where a stripe has two or more different widths, the optimum stripe width and length cannot be determined in simple fashion. The form of the light guided by each stripe portion is represented by linear coupling in transverse mode, the energy of light distributed among the transverse modes is calculated on the basis of the spatial coupling between the transverse mode of one stripe portion and that of the other stripe portion at a point where the stripe width changes, and each transverse mode is propagated through the stripe with a specific propagation constant. This process is repeated to determine the spot shape at the position of laser emission. In this case, for a satisfactory beam shape to be obtained, it is considered necessary that the energy of the transverse mode of third or higher mode is 10% or less of the total light energy for the stripe at the end surface, that the energy of the second-order transverse mode is in the range of 10% to 40% of the total light energy and that the phase difference between the zeroth-order transverse mode and the second-order transverse mode is in the range of π/6 to 5π/6.

The striped waveguide forming the laser resonator of this semiconductor laser device includes a region about 4 μm wide (corresponding to the region 206 in FIGS. 5A), a region of intermediate width of about 7 μm (corresponding to the region 207 in FIGS. 5A) and a wide region about 20 μm wide (corresponding to the region 208 in FIGS. 5A). The length of the wide region is about 30 μm, and that of the intermediate-width region is set to about 43 μm in such a manner that the phase difference between the dominant bode and the second-order mode is π/2 at the laser end surface. This structure permits a light intensity distribution to be obtained nearer to a triangle.

With a stripe structure having a plurality of widths, uneven current injection into the stripe can make the beam triangular in shape and at the same time can add the function of changing the width of the triangle. This is due to the fact that since the refractive index of the active layer of the semiconductor laser is reduced by the current injection, the current injection only at the peripheral portion of a stripe can reduce the second-order transverse mode without keeping substantially unchanged the number of waves associated with the propagation constant of the dominant mode. Even when the stripe length remains constant, therefore, the phase difference between the modes passing through the particular stripe can be changed. With the increase in current injection, the optical input is increased. Since an enlarged beam results from the change in refractive index as described above, however, the width as well as the height of the light intensity distribution is increased with the injection current.

Figure 8:
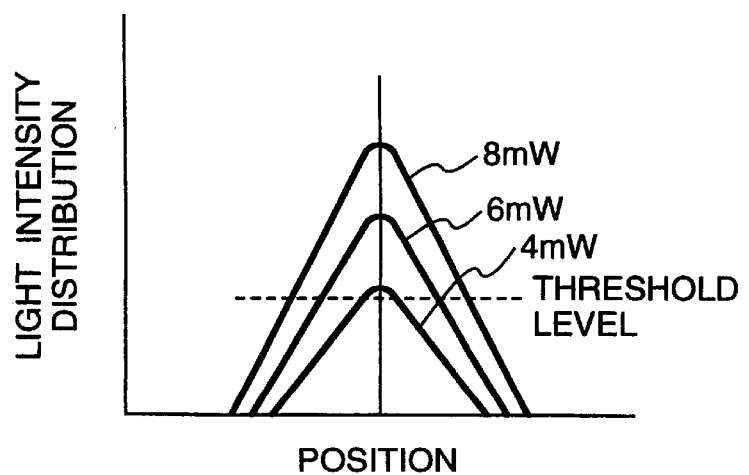
FIG. 8 is a diagram showing an intensity distribution of the light emitted from the semiconductor laser device according to the embodiment shown in FIGS. 6A-1, 6A-2, 6B-1 and 6B-2.

FIG. 8 shows a distribution of light intensity on a photoconductor surface when a semiconductor laser device according to the invention is driven with a light output of 4 mW, 6 mW or 8 mW. The light-sensing threshold of the photo-conductor film assumes a value defined by the dashed line in the drawings. The dot size printed, therefore, changes as a function of the light output simply according to the relation $W=2W_0(1-P_0/P)$. As in the embodiment shown in FIGS. 2A and 2B, therefore, a smooth print corresponding to the light output can be obtained with a high reliability.

A non-conductive region may be formed in the wide region 208 but not in the intermediate-width region 207.

Figure 10:
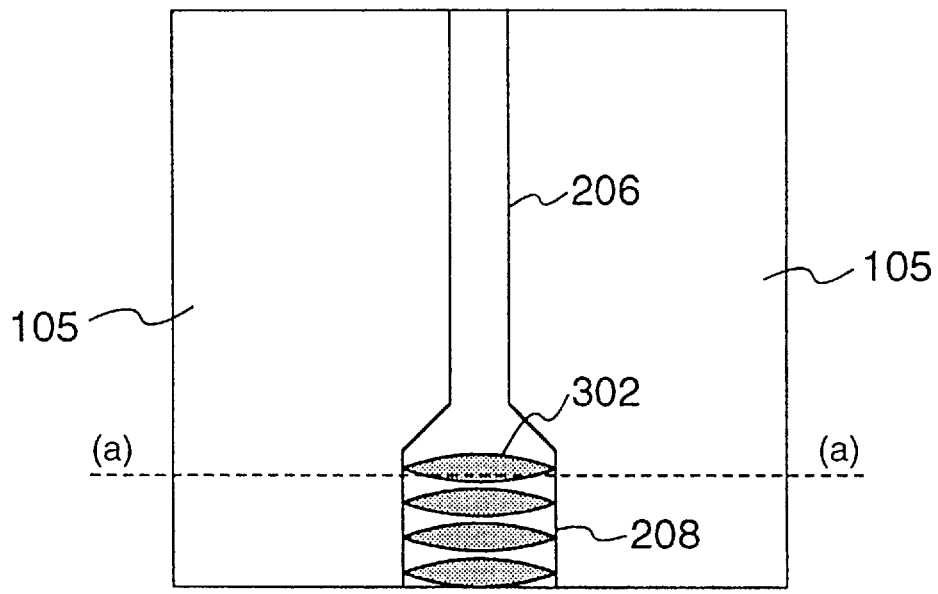
FIG. 10 is a plan view showing a semiconductor laser device in the process of fabrication according to still another embodiment.
Figure 11A:
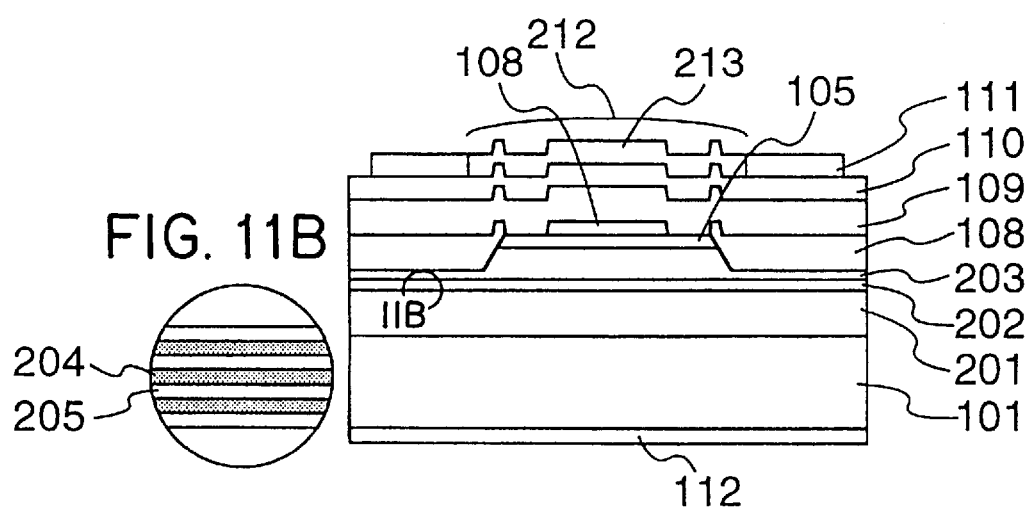

A further embodiment of the invention is described with reference to the accompanying drawings. FIGS. 11A and 11B show a sectional structure of a semiconductor laser device fabricated according to the present embodiment, and FIG. 10 is a plane view showing the same semiconductor laser device in the process of fabrication. A sectional structure at a position corresponding to line a—a in FIG. 10 is shown in FIGS. 11A and 11B. First, an n-$Al_{0.5}Ga_{0.5}As$ clad layer 102, a multiple quantum well active layer 103, a p-$Al_{0.5}Ga_{0.5}As$ clad layer 104 and a p-GaAs contact layer 105 are deposited in that order by crystal growth on an n-GaSs substrate 101. The multiple quantum well active layer 103 is formed by alternating each of three GaAs well layers 106 (7 nm) with each of four $Al_{0.3}Ga_{0.7}As$ barrier layers 107 (5 nm).

Next, a striped SiO2 film 206 is formed in the shape as shown in FIG. 10 on the p-GaAs contact layer 105 using the thermal CVD process and photolithography. With this SiO2 film 206 as a mask, the p-GaAs contact layer 105 and the p-$Al_{0.5}Ga_{0.5}As$ clad layer 104 are etched off remaining about 0.3 μm. Further, in order to form a lens-shaped non-conductive region 302 in part of the SiO2 film, a portion of the $SiO_2$ film is removed from the particular part. After that, an n-$In_{0.5}Ga_{0.5}P$ block layer 301 is selectively deposited by the metal organic vapor-phase growth process in a region free of the SiO$_2$ film. In other words, the n–In$_{0.5}$Ga$_{0.5}$P block layer 301 is formed in the lens-shaped non-conductive region 302 and on the two sides of the striped SiO$_2$ film.

After removing the SiO$_2$ film in order to reduce the series resistance of the device, a p–Al$_{0.5}$Ga$_{0.5}$As buried layer 109 and a p-GaAs cap layer 110 are formed. Then, the electrode 111 is formed with Au as a main component on the surface of the wafer.

In the process, the surface electrode 111 is formed with a region 212 from which a portion of the electrode is removed by the normal lift-off process. There exists no electrode buy only the SiO$_2$ mask used for lift-off remains on the waveguide of the semiconductor laser. As a result, diffusion of a metal element into the semiconductor or stress generated therein due to the breakage of the electrode is prevented, and a device with a high reliability is realized. The electrode structure according to this embodiment is effective generally with a ridge-buried semiconductor laser, but especially with the present embodiment in which complicated unevennesses are generated in the surface of the waveguide.

The GaAs substrate is etched to about 100 μm by mechanical grinding and chemical process thereby to form the electrode 112 with Au as a main component on the GaAs substrate. A semiconductor wafer of this structure is cleaved into bars at intervals of about 600 μm as a semiconductor laser device.

The striped waveguide constituting a laser resonator of this semiconductor laser device includes a region about 5 μm wide (corresponding to the region 206 in FIG. 10) and a wide region about 8 μm wide (corresponding to the region 208 in FIG. 10). The length of the wide region about 8 μm wide is set to about 100 μm to assure that the phase difference between the dominant mode and the high-order mode is π/2 at the end surface of the laser since the propagation constant of the dominant mode and the higher order mode of this stripe are K$_0$=3.3297 (2π/λ), and K$_2$=3.3273 (2π/λ). Also, a modulated injection region partially having the n–In$_{0.5}$Ga$_{0.5}$P block layer 301 is formed in the wide region. This structure secures a substantially triangular light intensity distribution. Also, since the beam diameter is extended with the increase in light output due to the effect of the modulated injection region, a larger change in the beam shape can be attained.

With a stripe of this shape, the laser beam expands as it proceeds toward the end surface. An astigmatism thus occurs adversely affecting the focusing of the beam through the optical system. This astigmatism can be corrected by forming a refractive index distribution in the shape of convex lens by current injection into the stripe in the neighborhood of the end surface from which the light is emitted.

In this structure, the astigmatism of the laser beam is corrected by forming a modulated injection region in the shape of convex lens as shown in FIG. 10 in a wide region. The dot size printed changes in proportion to the light output. In any operating state, the change rate of light intensity in the vicinity of the light sensitivity threshold is considerable, so that a smooth print is realized corresponding to the light output. In addition, with this laser, the change in light output due to the current injection is absorbed primarily by the beam size variations, leading to a small change in peak power. Even in the case of multicolor printing using a plurality of charge levels, therefore, the printing is possible with variable spot diameters. Also, the astigmatism is so small due to the effect of the aberration correction that an inexpensive apparatus is realized without any need of optically correcting the aberration at the time of apparatus assembly.

As still another embodiment of the invention, a semiconductor laser device is explained with a semiconductor laser according to the present embodiment arranged in an array. The semiconductor laser device shown in FIG. 12 comprises a plurality of semiconductor laser devices 4 of FIG. 1 at intervals of 50 μm with the waveguide portion thereof shown in the drawings.

First, an n–(Al$_{0.5}$Ga$_{0.5}$)$_{0.5}$In$_{0.5}$P clad layer 201, a multiple quantum well active layer 202, a p–(Al$_{0.5}$Ga$_{0.5}$)$_{0.5}$In$_{0.5}$P clad layer 203 and a p-GaAs contact layer 105 are formed in that order by crystal growth on an n-GaAs substrate 101. The multiple quantum well active layer 202 is formed by alternate deposition of each of three Ga$_{0.5}$In$_{0.5}$P well layers 204 and each of four (Al$_{0.5}$Ga$_{0.5}$)$_{0.5}$In$_{0.5}$P barrier layers 205.

Figure 12:
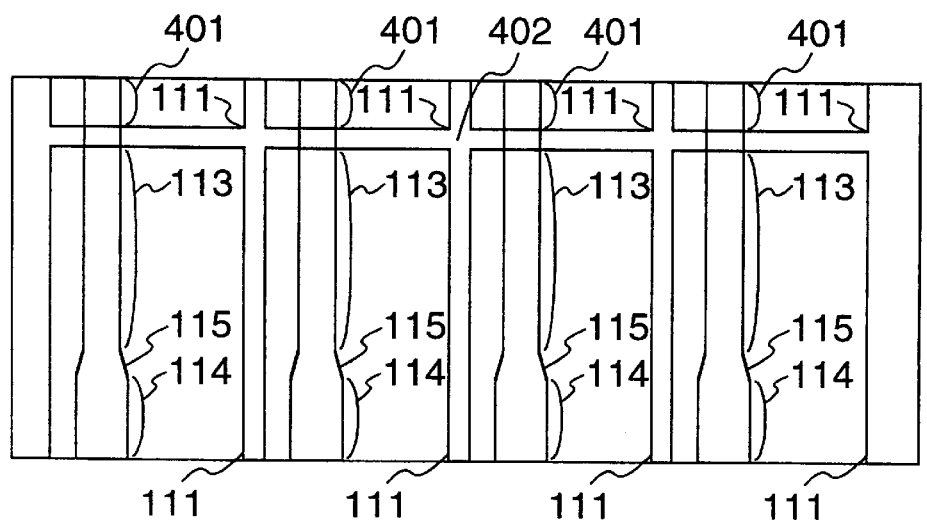
FIG. 12 is a plan view showing a semiconductor laser device in the process of fabrication according to a further embodiment.

Next, a striped SiO$_2$ film is formed in the shape shown in FIG. 12 on the p-GaAs contact layer 105 using the thermal CVD process and photolithography. This mask has the stripe 206 of normal width (about 4 μm) occupying the major portion of the device which expands to about 6 μm in the neighborhood of the end surface. With this SiO$_2$ film as a mask, the p-GaAs contact layer 105 and the p–(Al$_{0.5}$Ga$_{0.5}$)$_{0.5}$In$_{0.5}$P clad layer 203 are partially etched off. After that, the n-GaAs block layer 108 is selectively deposited in a region free of the SiO$_2$ film by the metal organic vapor-phase growth process.

Then, the SiO$_2$ film is removed in order to reduce the series resistance of the device, after which the p-GaAs cap layer 110 is formed.

According to this embodiment, the p-GaAs contact layer 105 is formed in the thickness of about 20 μm for the purpose of reducing the heat resistance of the device. Also, according to this embodiment, an electrode-isolating SiO$_2$ mask 402 for electrically isolating the light output monitor region 401 in each waveguide and the waveguide ends is formed before the growth of the p-GaAs contact layer 105. Each region is electrically isolated by selective growth of the p-GaAs contact layer 105 with this mask 402.

As the next process, the electrode 111 is formed with Au as a main component on the wafer surface. A region 212 free of the electrode is formed on the surface electrode 111 using the normal lift-off method. There exists no electrode but only the SiO$_2$ mask 213 used for lift-off remains on the waveguide of the semiconductor laser. As a consequence, the diffusion of a metal element into and generation of stress in the semiconductor due to the breakage of the electrode or the like is prevented and a device with a high reliability is realized. This electrode structure is generally effective for the ridge-buried semiconductor laser. Especially, it is effective for the present invention in which complicated unevennesses are generated in the surface of the waveguide.

According to this embodiment, the surface electrode 111 has the waveguide thereof formed at a position about 5 μm away from the electrode end. This is in order to secure a sufficient area to permit a conducting metal wire to be bonded to the electrode by avoiding the waveguide passage.

After the GaAs substrate is etched off to about 100 μm by mechanical grinding and chemical process, an electrode 112 with Au as a main component is formed on the GaAs substrate. This semiconductor wafer is cleaved into bars at intervals of about 600 μm as a semiconductor laser device. The semiconductor laser of this embodiment oscillates at about wavelength of 680 nm.

Figure 14:
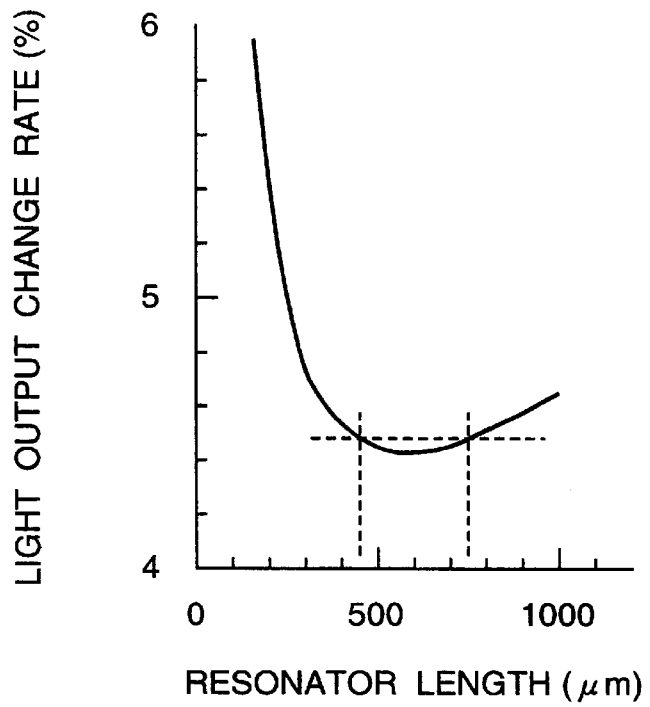
FIG. 14 shows the characteristics of the optical output change rate versus the resonator length of a semiconductor laser device according to the embodiment of FIG. 13.

The semiconductor laser chip thus fabricated is bonded to a heat sink of SiC from the back electrode side thereof and assembled as a product. In the case where the semiconductor laser is bonded to a heat sink from the back electrode in this way, the problem is that the semiconductor laser output changes due to the heat generated by current. According to the present embodiment, the resonator length is set between 450 $\mu$m and 1200 $\mu$m on the basis of the result of calculating the dependency of light output change due to heat generation on the resonator length as shown in FIG. 14.

A striped waveguide forming a laser resonator of this semiconductor laser device includes a region 113 about 4 $\mu$m wide, an wide region 114 about 7 $\mu$m wide. The propagation constant of the dominant mode and the higher order mode are $K_0$=3.315 ($2\pi/\lambda$), and $K_2$=3.310 ($2\pi/\lambda$), while the length of the intermediate-width region is set to about 34 $\mu$m so that the phase difference between dominant mode and high-order mode is $\pi/2$ at the laser end surface. This structure provides a light intensity distribution in a form nearer to a triangle.

The light intensity distribution on the light-sensitive surface obtained when a semiconductor laser device according to the present embodiment is driven with a light output of 4 mW, 6 mW and 8 mW is shown in FIG. 8. The light-sensing threshold of the light-sensitive material assumes a value indicated by dashed line. Since the dot size printed changes in proportion to the light output, a smooth print corresponding to the light output is obtained as in the embodiment of FIGS. 2A and 2B.

Figure 13:
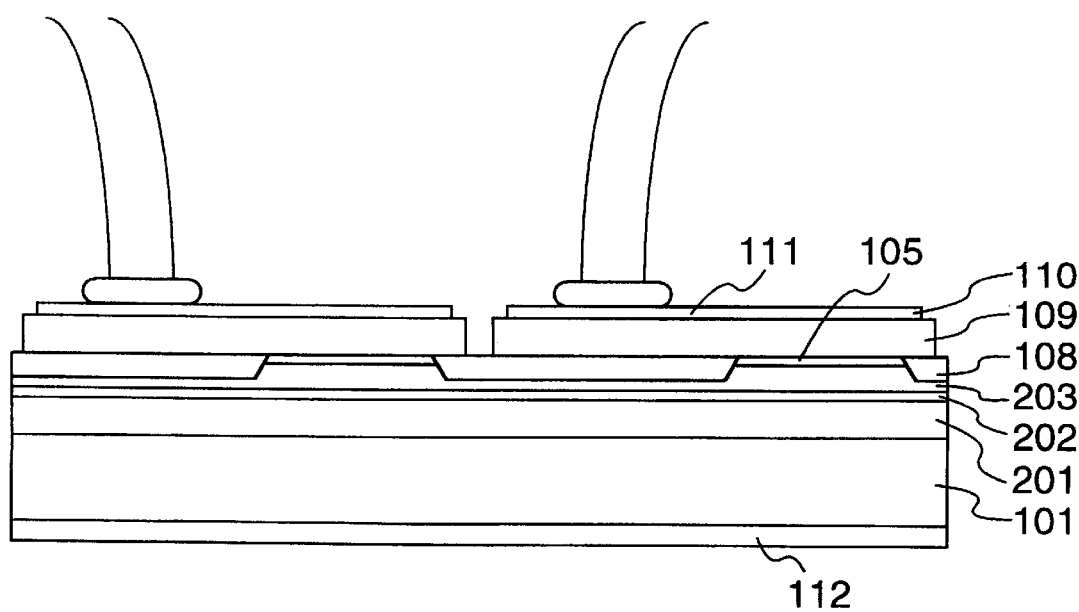
FIG. 13 is a diagram showing a sectional structure of a semiconductor laser device fabricated through the process shown in FIG. 12.

In the semiconductor laser device of FIG. 13, the semiconductor laser is oscillated by the current of a main electrode. According to this embodiment, a plurality of semiconductor lasers in array having this configuration further includes regions 401 each for monitoring the light output for each waveguide. The monitor region 401, as described above, is isolated from other electrodes by an electrode-isolating $SiO_2$ mask. This isolated region is supplied with a voltage opposite in polarity to or lower than the operating voltage of the semiconductor laser. Then, carriers excited by the laser light in the monitor region generates an optical current. The light output can be monitored by measuring this optical current. Since the monitor region 401 is formed in the waveguide, the light output for each waveguide can be determined. The light output monitor function is steadily obtained by applying a voltage of polarity opposite to the operating voltage of the semiconductor laser to the monitor region. In the case where a voltage of the same polarity as the operating voltage of the semiconductor laser is applied to recover the energy generated by light absorption in the monitor region efficiently as electrical energy, however, a function can be obtained of cooling the particular region electronically, thereby making it possible to prevent the end surface of the semiconductor laser from deterioration.

According to this embodiment, the high-resolution printing due to a change in dot size and the high-speed printing due to an array configuration can be realized at the same time. Thus, a high-performance semiconductor laser having a printing capacity about 10 times in terms of the printing speed multiplied by the dot density can be realized by a laser printing apparatus having the same configuration as the conventional apparatus except for the semiconductor laser and the drive means thereof.

When the semiconductor laser device according to this embodiment is used with the laser printer described in FIG. 3, a large change in beam size is obtained for each device by a comparatively small change in light output. Thus a superior printing operation at high speed is possible with small crosstalks between device elements.

A similar feature of course is obtained by an array structure of the embodiments shown in FIGS. 6A-1, 6A-2, 6B-1 and 6B-2 and 10.

Figure 15:
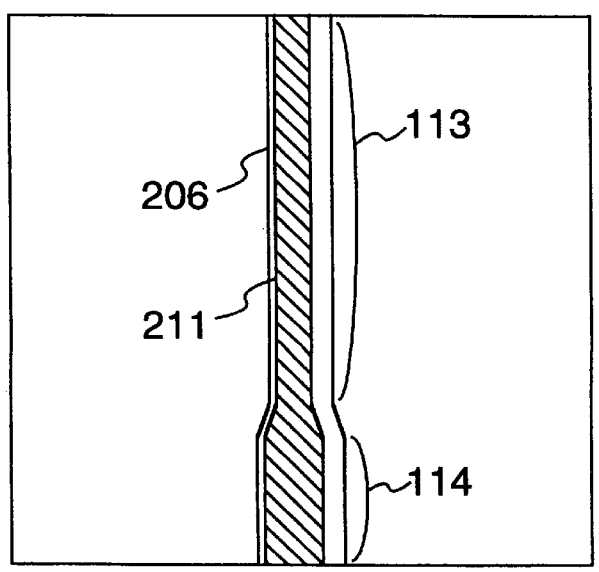
FIG. 15 is a plan view of a semiconductor laser device in the process of fabrication according to a still further embodiment.

A still further embodiment of the invention is described with reference to the accompanying drawings. FIGS. 16A and 16B are a diagram showing a sectional structure of a semiconductor laser device fabricated, and FIG. 15 is a plan view showing the same semiconductor laser device in the process of fabrication. First, an n-$(Al_{0.7}Ga_{0.3})_{0.5}In_{0.5}P$ clad layer 502, a multiple quantum well active layer 503, a p-$(Al_{0.7}Ga_{0.3})_{0.5}In_{0.5}P$ clad layer 504 and a p-GaAs contact layer 105 are deposited in that order on a misoriented n-GaAs substrate 501 {(100) substrate misoriented with 15 degree toward (110) direction} by crystal growth. The multiple quantum well active layer 503 is formed of three $Ga_{0.5}In_{0.4}P$ well layers 505 each alternately with each of four $(Al_{0.7}Ga_{0.3})_{0.4}In_{0.5}P$ barrier layers 506.

Next, a striped composite mask composed of a photoresist mask 206 and an $SiO_2$ mask 211 as shown in FIG. 15 is formed using the thermal CVD process and photolithography. This composite mask is produced by first forming an $SiO_2$ mask having a groove along the periphery of the desired pattern, then forming the photoresist mask 206 in a manner to cover the desired pattern and the peripheral groove, after which the $SiO_2$ mask portion external to the groove is etched off thereby to retain intact only the desired $SiO_2$ pattern covered by the photoresist.

The photoresist mask is so shaped that a stripe 206 having a normal width (about 5 $\mu$m) representing the major portion of the device expands to about 8 $\mu$m in the vicinity of the end surface. The p-GaAs contact layer 105 and the p-$(Al_{0.5}Ga_{0.5})_{0.5}In_{0.5}P$ clad layer 203 are partially etched off using this photoresist mask. After that, an n-GaAs block layer 108 is selectively deposited in a region free of the $SiO_2$ film by the metal organic vapor-phase growth process.

Next, in order to reduce the series resistance of the device, the $SiO_2$ film is removed, followed by forming a p-$Al_{0.5}Ga_{0.5}As$ buried layer 109 and a p-GaAs cap layer 110.

If a substrate displaced from (100) orientation is used, the waveguide becomes asymmetric in shape. According to the embodiment under consideration, therefore, the photoresist mask defining the shape of the waveguide and the $SiO_2$ mask defining the current path are formed by being displaced in such a direction as to correct the asymmetry of the waveguide. In this embodiment, axial displacement between photo resist mask and $SiO_2$ mask is set at 1 $\mu$m in the slant direction of the substrate surface.

Then, an electrode 111 with Au as a main component is formed on the wafer surface. In the process, a region 212 from which a portion of the electrode is removed by the normal lift-off process is formed on the surface electrode 111. Thus there exists no electrode but only the $SiO_2$ mask 213 used for lift-off remains on the waveguide of the semiconductor laser. As a result, diffusion of a metal element into or generation of stress in the semiconductor due to the breakage of the electrode is prevented, and a reliable device is realized. This electrode structure is generally effective for the semiconductor laser of ridge-buried type. Especially, a great effect is obtained for the device according to the present invention in which complicated unevennesses occur in the waveguide surface.

After etching the GaAs substrate to about 100 $\mu$m by mechanical grinding and chemical process, an electrode 112 with Au as a main component is formed also on the GaAs substrate. This semiconductor wafer is cleaved into bars at spatial intervals of about 600 μm to produce a semiconductor laser device. The semiconductor laser of this embodiment oscillated at about frequency of 650 nm.

A striped waveguide making up the laser resonator of this semiconductor laser device includes a region about 5 μm wide, an wide region about 8 μm wide. The propagation constant of the dominant mode and the higher order mode are $K_0=3.30 (2\pi/\lambda)$, and $K_2=3.3025 (2\pi/\lambda)$, and the length of the intermediate-width region is set to about 65 μm so that the phase difference between the dominant mode and the second-order mode is $\pi/2$ at the laser end surface. This structure can achieve a light intensity distribution in a shape more similar to a triangle.

The light intensity distribution obtained on a light-sensitive surface when the semiconductor laser device according to this embodiment is driven with a light output of 4 mW, 6 mW and 8 mW is shown in FIGS. 16A and 16B. The light-sensing threshold of the light-sensitive material assumes the value shown by dashed line. The dot size printed, therefore, changes as a simple function of the light output change according to the relation $W=2W_0(1-P_0/P)$. A smooth print corresponding to the light output thus is realized with high reproducibility as in the first embodiment.

We claim:

1. A semiconductor laser device comprising two semiconductor layers of different conduction types formed on a semiconductor substrate, an active layer of a semiconductor material formed between said two semiconductor layers and having a forbidden band width narrower than said two semiconductor layers, and a waveguide for enclosing the light within a plane parallel to said active layer, wherein:

said waveguide includes at least two regions of different widths, the wide one of the regions being located in the vicinity of the end surface of the semiconductor laser, and the relation holds that $\pi/6 < L \times (K_0-K_2) < \pi \times 5/6$ ($K_0$, $K_2$ and L are real numbers), where L is the length of the wide waveguide region and $K_0$ and $K_2$ are the propagation constants of the zeroth-order transverse mode and the second-order transverse mode respectively propagating through the wide waveguide region.

2. A semiconductor laser device according to claim 1, wherein said waveguide region having a large width is set to such a length that the zeroth-order transverse mode and the second-order transverse mode generate a phase difference of about $\pi/2$ as they propagate through said waveguide region.

3. A semiconductor laser device according to claim 1, wherein a part of said waveguide has a current injection amount and a current injection density different from other regions of the waveguide.

4. A semiconductor laser device according to claim 1, wherein a laser beam is oscillated by supplying current between the electrodes formed on the front and back sides of a substrate of said semiconductor device, said electrodes being formed in a region other than said waveguide.

5. A semiconductor laser device according to claim 1, wherein current is injected into said waveguide at a position displaced from the center axis of said waveguide.

6. A semiconductor laser device according to claim 1, wherein the wider one of said waveguide regions has a part injected with a different amount of current from other parts of said region.

7. A semiconductor laser device according to claim 1, comprising a plurality of semiconductor laser elements arranged in the same orientation on a plurality of identical substrates.

8. A semiconductor laser device according to claim 7, comprising a heat sink bonded with the back side of the substrate of said semiconductor laser device, wherein the length of the resonator of said semiconductor laser is in the range of 450 μm to 1200 μm.

9. A semiconductor laser device according to claim 7, comprising a pair of electrodes disposed on the front and back sides of said substrate for oscillating a laser beam in response to the current supplied therebetween, wherein said electrode on the front side is displaced from the center of the laser stripe.

10. A semiconductor laser device according to claim 9, wherein said electrode formed on the front side of said substrate has a monitor region partially isolated from other regions of said waveguide, and the photoelectromotive force of the monitor region thus isolated is used for monitoring the light output of said semiconductor laser.

11. A semiconductor laser device according to claim 9, wherein a laser beam is oscillated by supplying current between a pair of electrodes formed on the front and back sides of a substrate, the electrode on the front side of the substrate being electrically isolated from other regions in the vicinity of the end surface of said semiconductor laser, said isolated region being supplied with a voltage lower than other regions of the semiconductor laser.

12. An optical printing apparatus using the semiconductor laser device according to any one of claims 1 to 11, comprising a light-sensitive material used for optical printing, said semiconductor laser device for optically recording on said light-sensitive material, means for changing the position of said light-sensitive material irradiated by the laser, and means for controlling said semiconductor laser device on the basis of the light output intensity distribution of said semiconductor laser device.

* * * * *